(12) United States Patent
Wright

(10) Patent No.: US 6,236,094 B1
(45) Date of Patent: *May 22, 2001

(54) LOW RESISTANCE GATE ELECTRODES

(75) Inventor: Peter J. Wright, Sunnyvale, CA (US)

(73) Assignee: Altera Corporation, San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/338,453

(22) Filed: Jun. 22, 1999

Related U.S. Application Data

(62) Division of application No. 09/089,295, filed on Jun. 1, 1998, now Pat. No. 5,966,597.
(60) Provisional application No. 60/070,611, filed on Jan. 6, 1998.

(51) Int. Cl.$^7$ ................................................ H01L 21/336
(52) U.S. Cl. ...................... 257/413; 257/750; 257/360; 438/197; 438/592
(58) Field of Search .................................. 257/413, 750, 257/360; 438/197, 592

(56) References Cited

U.S. PATENT DOCUMENTS

| | | |
|---|---|---|
| 4,944,836 | 7/1990 | Beyer et al. . |
| 5,227,320 | 7/1993 | Johnson et al. . |
| 5,268,330 | 12/1993 | Givens et al. . |
| 5,306,951 | 4/1994 | Lee et al. . |
| 5,447,874 | 9/1995 | Grivna et al. . |
| 5,532,178 * | 7/1996 | Liaw et al. ............................ 437/57 |
| 5,595,937 | 1/1997 | Mikagi . |
| 5,688,706 * | 11/1997 | Tseng ..................................... 437/45 |
| 5,856,225 | 1/1999 | Lee et al. . |

OTHER PUBLICATIONS

S. Wolf, Silicon Processing for the VLSI Era, vol. 3—The Submicron MOSFET.
Lee, et al., 1988, A Selective CVD Tungsten Local Interconnect Technology, IEDM.
Chatterjee, et al., 1997, Sub–100nm Gate Length Metal Gate NMOS Transistors Fabricated by a Replacement Gate Process, IEDM.
Cleemput, et al., Jul. 1997, HDPCVD Films Enabling Shallow Trench Isolation, Semiconductor International.
Gail Robinson, Sep. 29, 1997, Silicide phase change used to break connections—PROM fuse design scales to sub–0.25 micron, EE Times, Issue 973.
Subbanna, S. et al., "A High–Density 6.9 Sq. Mu M Embedded SRAM Cell in a High Performance 0.25 Mu M–Generation CMOS Logic Technology", 1996.
Subbanna, S. et al., "A Novel Borderless Contact/Interconnect Technology Using Aluminum Oxide Etch Stop for High Performance SRAM and Logic", 1993.
Gail Robinson, Sep. 29, 1997, 'Disposable' polysilicon approach sidesteps high–temperature problems—Process variation offers low–resistance gates, EE Times, Issue 973.

* cited by examiner

*Primary Examiner*—Alexander O. Williams
(74) *Attorney, Agent, or Firm*—Beyer Weaver & Thomas, LLP

(57) ABSTRACT

Provided is a transistor device, and a process for fabricating such a device, in which a top portion of a polysilicon gate electrode is removed and replaced by a low resistance metal material using a damascene process. Gate electrodes in accordance with the present invention provide improved conductivity over conventional polysilicon and silicide-capped polysilicon gate electrodes, due to the low resistivity of the metal, but do not have the drawbacks associated with the complete removal and replacement of polysilicon with a metal.

15 Claims, 5 Drawing Sheets

Prior Art

LOW RESISTANCE GATE ELECTRODES

CROSS-REFERENCE TO RELATED APPLICATIONS

This is a Divisional application of prior application Ser. No. 09/089,295 filed on Jun. 1, 1998, is now U.S. Pat. No. 5,966,597 the disclosure of which is incorporated herein by reference.

This application claims the benefit of the filing date of Provisional Application Ser. No. 60/070,611, entitled METHOD OF FORMING LOW RESISTANCE GATE ELECTRODES, filed Jan. 6, 1998.

BACKGROUND OF THE INVENTION

The present invention relates generally to semiconductor devices. More particularly, the invention relates to a process for forming low resistance gate electrodes in semiconductor devices.

Typical silicon MOS devices have a polysilicon gate and silicon dioxide as an insulator. The polysilicon/silicon dioxide system is well known in the art and can be controlled. However, the polysilicon can have a high resistance (greater than about 20 $\Omega/[\ ]$) and this resistance can limit the speed of the circuits fabricated with this system. Previous approaches to lowering the resistance of a polysilicon gate electrode have included the formation of a silicide region on the top of an MOS transistor's polysilicon ("poly") gate electrode. Silicide layers are conventionally formed by a variety of processes, including: (1) depositing a lower resistance conductor, such as a silicide (for example tungsten silicide ($WSi_2$), titanium silicide ($TiSi_2$), and cobalt silicide ($CoSi_2$)) on the polysilicon that is mechanically defined with the polysilicon, or (2) depositing a refractory metal and forming a silicide on the polysilicon. The silicide has a lower resistance than the underlying doped silicon or poly. As a result, signal propagation through the poly gate electrode is enhanced.

FIGS. 1A through 1E illustrate a conventional silicide process on a portion of a semiconductor wafer, such as is also described in S. Wolf, et al., *Silicon Processing for the VLSI Era*, vol.1, 397–399 (Lattice Press, 1986), which is incorporated by reference herein for all purposes. In FIG. 1A, a portion of a semiconductor wafer 100 having a semiconductor substrate 101 (typically monocrystalline silicon) is shown. The substrate 101 has gate oxide 102 and poly 104 layers generated successively on its upper surface 106. The gate oxide 102 and poly 104 layers are created in ways well known to those of skill in the art. For example, the gate oxide may be silicon dioxide ($SiO_2$) generated by thermal oxidation of surface 106 of the silicon substrate 101, and the poly 104 may be deposited on the gate oxide 102 by chemical vapor deposition. FIG. 1B shows the wafer 100 after the poly layer 104 has been patterned and etched to form a gate electrode 108 according to methods well known in the art (e.g., photolithography and plasma etching).

At this point, an ion implantation may be performed to form at least a portion of the source and drain regions. This implant is sometimes referred to as a lightly doped drain (LDD) implant and is self-aligned with polysilicon gate electrode 108.

Next, as shown in FIG. 1C, a layer of dielectric 110 is deposited on the wafer surface, covering both the gate oxide 102 and the gate electrode 108. The wafer is then subjected to an anisotropic etch which removes the dielectric 110 and gate oxide 102 on all exposed horizontal surfaces. The remaining dielectric 110 provides vertical spacers 112. It should be noted that the terms "horizontal" and "vertical" are used herein relatively and with reference to a major surface of a semiconductor wafer, and may be interchanged. The spacers 112 act as an ion implantation mask for subsequent ion implant procedures which are used to dope portions of the substrate 101 adjacent to the gate electrode 108 in order to create or complete (depending on whether an LDD implant was performed) source 114 and drain 116 regions, as shown in FIG. 1D. The spacers 112, together with the remaining gate oxide 102, separate the poly gate 108 from the source 114 and drain 116 regions.

As shown in FIG. 1E, after ion implantation, a silicide (e.g., $WSi_2$) may be deposited on the gate electrode. Alternatively, a refractory metal, such as titanium (Ti) or cobalt (Co), may be deposited on the wafer surface, and silicide layers 120, 122 and 124 are formed on the poly gate 108, source 114, and drain 116 regions, respectively, by reaction with the underlying poly/silicon by an alloy step well known in the art. Then, unreacted Ti is removed by a selective wet etch process, also well known in the art.

The conventional process of FIGS. 1A–1E results in the formation of silicide on the top surface of the gate providing a thin surface layer of improved conductivity. Both of these methods can lower the gate electrode resistance to about 1–10 $\Omega/[\ ]$, and are compatible with subsequent high temperature steps in semiconductor processing. Until now, most processes did not require additional reductions in resistance. However, deep sub-micron device sizes require more significant reductions in resistance.

In order to further reduce resistance in polysilicon gates, several additional approaches have been proposed. In one approach, the silicide in a conventional process, such as that described above, is replaced with selectively deposited metal, such as described in V. V. Lee et al., A selective CVD metal local interconnect technology. IEEE Proceedings of the Int'l. Electron Devices Mtg. 1988 (IEDM 88), pp. 450–53. Since metals have much lower resistivities than silicides, resistance in the polysilicon gate electrode is further reduced. Another approach involves forming a silicide layer on the sidewalls of the gate as well as the top surface, such as described in U.S. Pat. Nos. 5,227,320 and 5,306,951. By enlarging the surface area of the gate electrode covered by silicide relative to the conventional silicide process, signal propagation through the gate is improved.

Still another strategy for reducing resistance in MOS transistor gates involves replacing the polysilicon gate material with a material having a lower resistance, such as a metal, such as described by Chatterjee et al., Sub-100 nm Gate Length Metal Gate NMOS Transistors Fabricated by a Replacement Gate Process. IEEE Proceedings of the Int'l. Electron Devices Mtg. 1997 (IEDM 97), 821–24. This process is illustrated in FIGS. 2A–C. In FIG. 2A, a partially-formed semiconductor device is shown. The device 200 includes a silicon substrate 202 with implanted source 203 and drain 204 regions defining a channel region 206 in the substrate 202. The substrate 202 is covered by a gate dielectric 208, typically silicon dioxide. A polysilicon ("poly") gate electrode 210 is positioned above the channel region 206 in the substrate 202. The poly gate electrode is bounded by dielectric spacers 212. This fabrication is achieved by conventional semiconductor processing techniques well known in the art. During its fabrication to this stage, the device 200 was covered with a layer of isolation oxide 214 and then planarized by CMP until the top surface 216 of the poly gate electrode is exposed.

As shown in FIG. 2B, the polysilicon gate electrode material is then removed by a wet etch process well known in the art, exposing the channel region 206 in the substrate 202. Next, as shown in FIG. 2C, after a deglaze, an ultrathin gate oxide insulator 218 is grown by RTO, and possibly modified to form N-RTO by a remote plasma nitridization process following oxidation. Then, CVD titanium nitride (TiN) 220 is deposited on the gate dielectric followed by either aluminum (Al) or tungsten (W) deposition as the bulk of the replacement gate electrode material 222. These metal materials have a resistivity about an order of magnitude lower than suicides and offer corresponding advantages for gate electrode conductivity. Further processing may be conducted to produce the T-shaped gate structure illustrated in FIG. 2C.

While this structure provides a lower-resistance gate that conventional devices, it has a number of drawbacks. First, such a structure may have reliability issues since the TiN and metal/oxide interface is not well characterized in the art, in contrast to the well understood polysilicon/oxide interface.

Second, since the wet etch used to remove the poly gate electrode material 210 also removes the underlying gate oxide 208, a new gate oxide 218 must be regrown before the replacement gate electrode material (metal) 222 is added. This thermal gate oxide growth adds a step to the fabrication process. It also may cause the thermal budget of the process to be exceeded. In addition, the process uses a TiN layer 220 deposited between the new gate oxide 218 and the replacement gate electrode material 222, thereby adding a further step to the process. The addition of steps reduces the efficiency of a fabrication process.

The wet etch process also likely removes some material from the sidewall spacers 212, particularly when a typical 50% overetch process is used to ensure that all the gate material above the substrate is removed. The removal of sidewall spacer material may increase gate length and increase the length of the overlap of the gate electrode with the source and drain regions which leads to increased capacitance and associated undesirable changes in the characteristics of the semiconductor device and may increase cell size.

Moreover, in CMOS transistor devices it is desirable to have a n+ polysilicon gate electrode material for above the gate dielectric for NMOS devices, and a p+ polysilicon gate electrode material for above the gate dielectric for PMOS devices. The doping of the polysilicon gate electrode controls its work function and helps determine the threshold voltage of a CMOS transistor. In typical 5 V semiconductor devices, the p+ polysilicon gate electrode material for a PMOS device allows a threshold voltage of less than about 0.7 V without a conductive p+ buried channel. Similarly, the n+ polysilicon gate electrode material for the NMOS device allows a threshold voltage of less than about 0.7 V without a conductive n+ buried channel. Removal and replacement of the polysilicon gate electrode material with metal changes the gate electrode work function and disrupts the optimization of the threshold voltage of the CMOS transistor.

Accordingly, improved processes and apparatuses for further reducing device resistance and signal propagation delays are needed.

SUMMARY OF THE INVENTION

To achieve the foregoing, the present invention provides a transistor device, and a process for fabricating such a device, in which a top portion of a polysilicon gate electrode is removed and replaced by a low resistance metal material, preferably a metal such as aluminum or tungsten, using a damascene process. Gate electrodes fabricated in accordance with the present invention provide improved conductivity over conventional polysilicon and silicide-capped polysilicon gate electrodes, due to the low resistivity of the metal, but do not have the drawbacks associated with the complete removal and replacement of polysilicon with a metal.

These and other features and advantages of the present invention are described below with reference to the drawings.

DETAILED DESCRIPTION OF THE PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a transistor device, and a process for fabricating such a device, in which a top portion of a polysilicon gate electrode is removed and replaced by a low resistance metal material, preferably a metal such as aluminum or tungsten, using a damascene process. Gate electrodes fabricated in accordance with the present invention provide improved conductivity over conventional polysilicon and silicide-capped polysilicon gate electrodes, due to the low resistivity of the metal, but do not have the drawbacks associated with the complete removal and replacement of polysilicon with a metal.

FIGS. 3A through 3G illustrate cross-sectional views of a portion of a semiconductor wafer showing various stages in a process for replacing a top portion of the polysilicon and possibly other materials in a gate electrode with a metal in accordance with a preferred embodiment of the present invention. It should be understood that numerous variations of this process are permissible and within the scope of this invention. Further, it should be understood that the conditions recited herein are appropriate for devices having feature sizes in the neighborhood of about 0.15 to 0.18 μm. The process conditions may have to be modified somewhat for devices in other size regimes, according to design criteria known in the art.

Figure 1A:
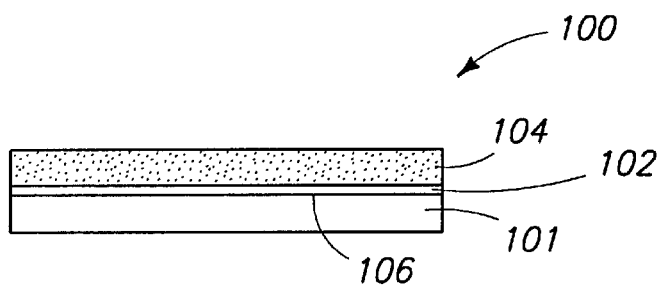
FIGS. 1A–E depict cross-sectional views of a portion of a semiconductor wafer showing various stages in a conventional silicide process.
Figure 1B:
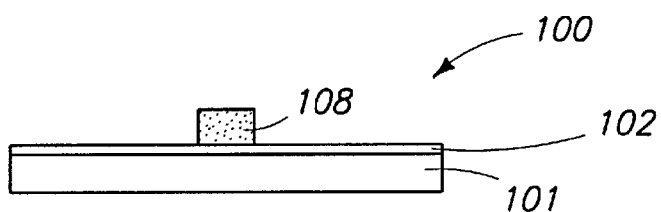
Figure 1C:
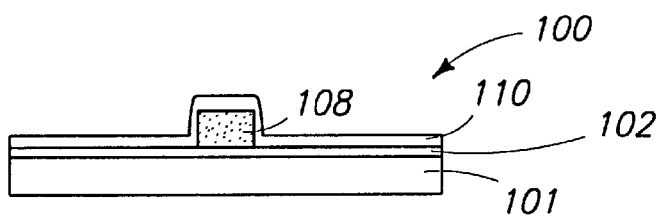
Figure 1D:
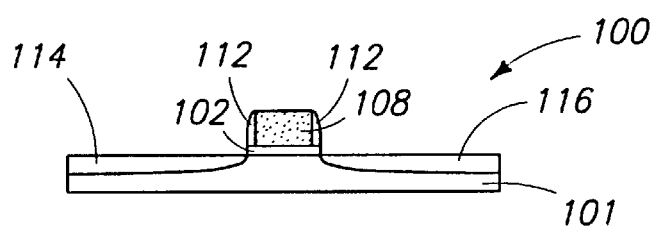
Figure 1E:
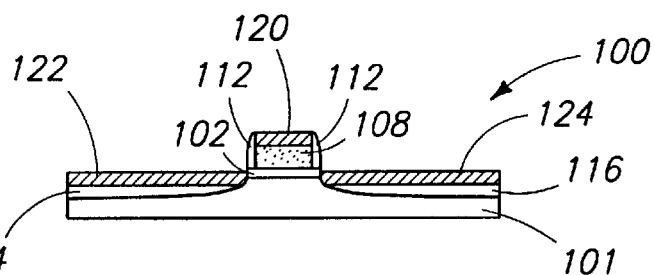
Figure 2A:
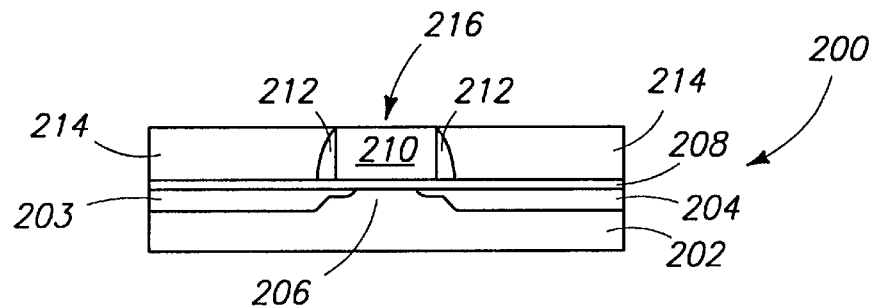
FIGS. 2A–C depict cross-sectional views of a portion of a semiconductor wafer showing various stages in a process for replacing all of the polysilicon in a gate electrode with a metal.
Figure 2B:
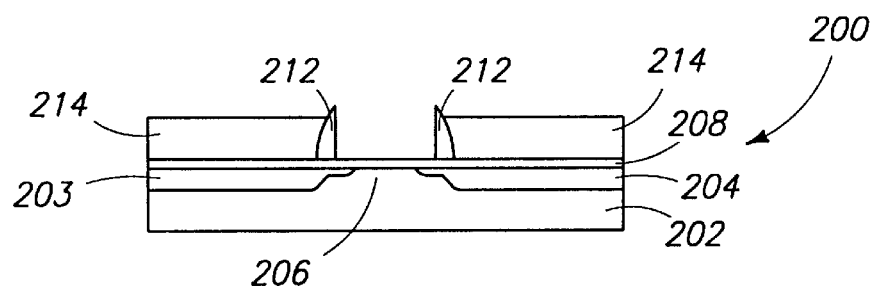
Figure 2C:
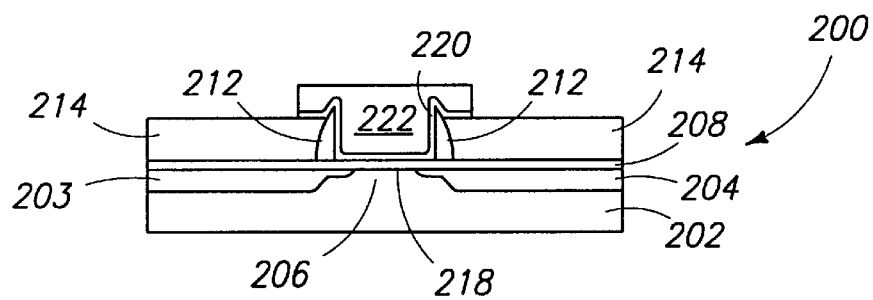
Figure 3A:
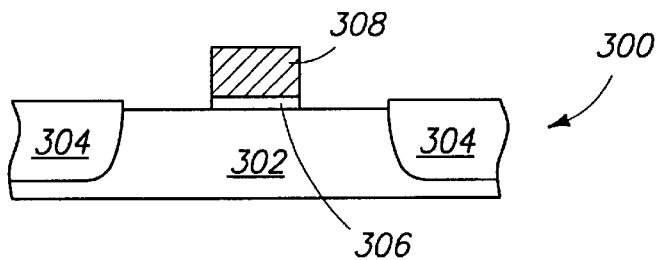
FIGS. 3A–G depict cross-sectional views of a portion of a semiconductor wafer showing various stages in a process for replacing a top portion of the polysilicon and/or silicide in a gate electrode with a metal in accordance with a preferred embodiment of the present invention.

FIG. 3A shows a partially-processed semiconductor wafer 300 including a semiconductor substrate 302. In a preferred embodiment, the semiconductor substrate 302 may be composed of single crystal silicon. The substrate 302 may contain one or more doped wells (not shown) created according to procedures well known to those of skill in the art. For example, a p-type ion implant may be performed over the substrate 302, penetrating an upper portion of the substrate (the "p-well portion"). This implant might be conducted with boron implanted at about $5 \times 10^{12}$ to $5 \times 10^{13}$ cm$^{-2}$ at an energy of between about 35 and 70 keV, for example. A subsequent diffusion anneal may then be conducted at a temperature and for a time sufficient to smooth out the p-type dopant concentration over well region to give a relatively uniform overall light p-doping level. In one embodiment, the well formation conditions may be chosen such that the p-well region has a dopant concentration at the substrate surface (i.e., the channel region) of between about $2 \times 10^{16}$ and $1 \times 10^{17}$ cm$^{-3}$.

It should be noted that, in many systems, the shape and extent of the p-well is defined by providing the semiconductor material with an ion implant mask of photoresist or other suitable masking material prior to ion implantation. Further alternative embodiments include silicon wafers cut from single crystal silicon grown with a specific dopant concentration, and growing a layer of silicon of the desired bulk concentration epitaxially on top of a heavily doped substrate, or substrate composed of gallium arsenide (GaAs) or other suitable semiconductor materials.

The substrate 302 may also optionally contain threshold adjustment implants. These implants (not shown) may be performed on the device substrate in order to set appropriate transistor threshold voltages. For example, an implant may be conducted with Boron (B) ions at a dose of between about $1 \times 10^{12}$ and $6 \times 10^{12}$ and an energy of between about 20 and 40 keV. Such wells and implants may be created according to procedures well known to those of skill in the art, and may be provided in the substrate 302 before or after the formation of isolation regions 304.

A gate dielectric 306, preferably silicon dioxide (SiO$_2$) formed by thermal processing or deposition according to procedures well known in the art, separates the substrate 302 from a gate electrode 308. For example, a gate oxide may be grown on the bare silicon surface in an oxygen-containing atmosphere at a temperature of between about 800 and 950° C. for about 20 to 100 minutes to produce a thickness of between about 20 and 90 Å over the substrate 302. Typically, the gate dielectric 302 will be a single layer of silicon dioxide, but it may also be a multi-layer structure including, for instance, silicon nitride.

Isolation regions 304 may be formed, according to procedures well known to those of skill in the art, to electrically isolate the various devices and some device elements from one another on the substrate 302. In deep submicron devices, a preferred isolation technique uses isolation trenches 304, as shown in FIG. 3A. The isolation trenches may be formed according to procedures well known to those of skill in the art, for example, trench regions may be patterned and etched, then filled with CVD dielectric (e.g., SiO$_2$), followed by planarization by RIE etch back and/or chemical mechanical polishing (CMP), as further described, for example, in Van Cleemput et al., HDPCVD Films Enabling Shallow Trench Isolation, Semiconductor International, vol. 20, no. 8, 179–186 (July 1997), the disclosure of which is incorporated be reference herein for all purposes.

In alternative embodiments, conventional field oxide regions rather than trenches 304 may be grown to isolate devices on the substrate 302. Such field oxide regions may be grown according to methods well known to those of skill in the art. For example, a thick silicon nitride and thin SiO$_2$ stack mask may be provided to protect the active area (i.e., region where source and drain electrodes and a channel, etc. are to be formed). Next, thick field oxide (preferably of silicon dioxide) may be grown at a temperature of between about 900 and 1050° C. to a thickness of between about 0.2 and 0.5 micrometers. Thereafter, the SiN/SiO$_2$ mask is removed.

The gate electrode 308 may be composed of any conventional gate electrode material, most commonly polysilicon. The gate electrode 308 is preferably formed by deposition, patterning and etching of polysilicon which may be conducted according to procedures well known in the art. For example, a blanket of polysilicon approximately 1000 to 2000 Å in thickness may be deposited over the wafer 300 surface by, for example, chemical vapor deposition. The polysilicon layer may be followed by a silicide (e.g., WSi$_2$) layer (not shown) of about 1000 to 2000 Å. A photoresist mask may then be formed on the surface of polysilicon (or polysilicon/silicide) layer over the desired gate electrode area. Once the mask is in place, an etch may be used to remove polysilicon and gate dielectric from the unmasked areas according to procedures well known to those of skill in the art, for example, a reactive ion etch (RIE) using SF$_6$/Cl$_2$.

The gate electrode 308 of the starting material for the present invention may also be composed of a plurality of layers, for example, an initial layer of polysilicon may be covered (capped) by one or more additional layers of material. Examples of such additional layers may include conductivity-enhancing materials such as silicides, for example, tungsten silicide (WSi$_x$) or titanium silicide (TiSi$_x$). The gate electrode might also or alternatively include other layers such as silicon nitride (Si$_3$N$_4$).

Figure 3B:
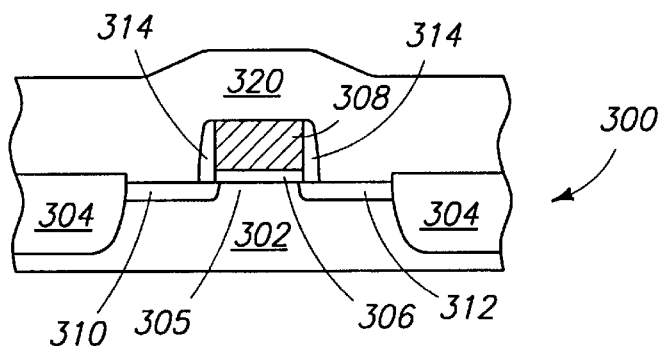

FIG. 3B illustrates the semiconductor wafer 300 following further processing. Vertical spacer dielectric regions 314 on either side of the gate electrode 308 may be formed in accordance with procedures well known to those of skill in the art. For example, a layer of dielectric may be deposited on the wafer surface, covering both the gate dielectric and the gate electrode 308. The wafer 300 is then subjected to an anisotropic etch which removes the dielectric on all exposed horizontal surfaces. The remaining dielectric on the sides of the gate electrode 308 provides vertical spacers 314. The spacers 314, together with the remaining gate oxide 306, separate the poly gate 308 from source 310 and drain 312 regions formed in the substrate 302. It should be noted that FIGS. 3A–G illustrate only one embodiment of the present invention, and that the use of vertical spacer dielectric regions 314, for example, is optional. Such spacers may be used less frequently as semiconductor device sizes and power requirements decrease.

Source 310 and drain 312 regions are implanted in the substrate 302 according to self-aligned implant procedures well known to those of skill in the art. That is, the gate electrode 308, gate dielectric 306, and optional spacers 314 may act as an ion implantation mask for ion implant procedures which are used to dope portions of the substrate 302 adjacent to the gate electrode 308 in order to create or complete source 310 and drain 312 regions. Then, any thermal budget work (i.e.: annealing and activating of source 310 and drain 312 implants) is conducted.

Following definition of the source and drain electrode 310 and 312 regions, a blanket of dielectric material 320 is deposited over the semiconductor wafer 300. The dielectric layer 320 may be deposited by methods known to those of skill in the art, for example chemical vapor deposition (CVD), or sputtering.

Figure 3C:
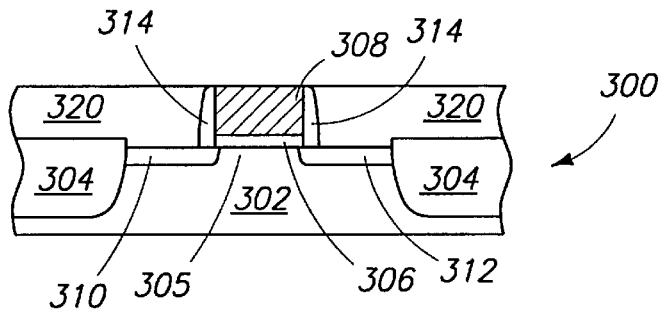

As shown in FIG. 3C, the semiconductor wafer is then planarized, removing the deposited dielectric material 320, until the top of the gate electrode 308 is exposed. In a preferred embodiment this planarization is conducted by chemical-mechanical polishing (CMP). Any other global planarization technique known to those of skill in the art, such as uniform dry etching, may also be used.

Figure 3D:
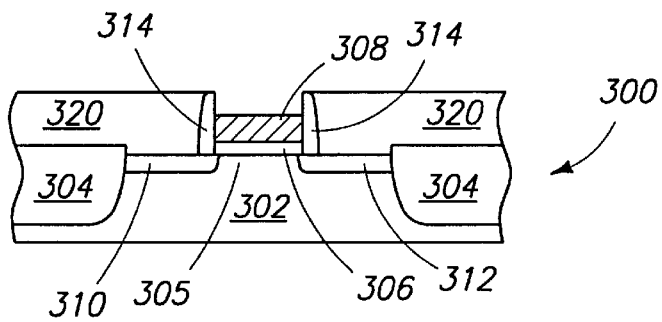

Following planarization, the gate electrode material is then thinned by removal of a top portion of the gate electrode material, as illustrated in FIG. 3D. This thinning may be accomplished by an etching technique known to those of skill in the art, for example conventional wet or dry chemical, plasma or other etching techniques, such as a reactive ion etch (RIE) using $SF_6/Cl_2$.

For a gate electrode composed of a single material, the thinning technique may be stopped once part, but not all, of the gate electrode material has been removed. This stopping point may be determined empirically for a given process with a given starting electrode material. Preferably, at least about one third, more preferably at least one half, of the total depth of the original gate electrode material is removed. Most preferably, a layer of the original polysilicon just sufficient to provide substantially the original gate electrode work function at the gate electrode/gate dielectric interface, and to withstand the stress of the subsequent metal deposition, is left. In a preferred embodiment, a layer of polysilicon from about 100 to 1000 Å deep on the gate dielectric 306 is sufficient for these purposes. Of course, a lesser thickness of the top portion of the gate electrode may also be removed, as noted above.

The thinning process may be simplified where the starting material for the gate electrode 308 is composed of more than one material in layers by using an etch technique which is selective to the top-most material over a lower layer of material. In this instance, the etching will substantially slow or stop when once the upper layer is removed and the lower layer is reached. As with the single material gate electrode situation described above, in a preferred embodiment, a layer of polysilicon from about 100 to 1000 Å deep on the gate dielectric 306 remains following the material removal step.

Figure 3E:
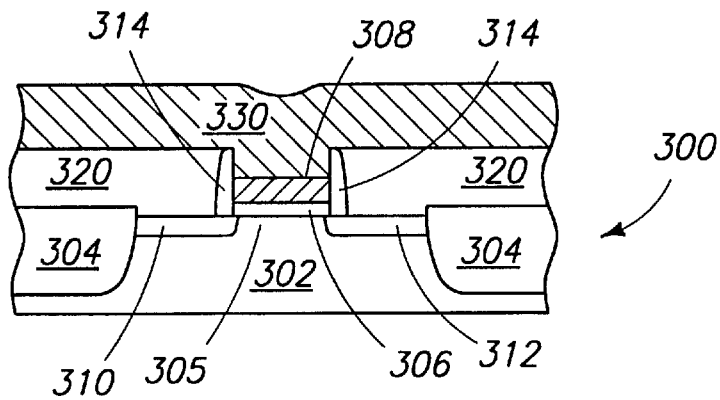

Then, as illustrated in FIG. 3E, a low resistance material 330, that is, a material having a lower resistance than polysilicon, such as a metal, for example, aluminum (Al) or tungsten (W) is deposited over the wafer 300. Preferably, the low resistance material will have a resistance of about 100 to 500 mΩ/[ ]. This low resistance material may be deposited according to a number of procedures well known in the art for example sputtering, CVD, or electroplating. The deposition should be conducted using a procedure whereby the deposited material substantially fills the region between the spacer dielectric regions 314 where the initial gate electrode material was removed.

Figure 3F:
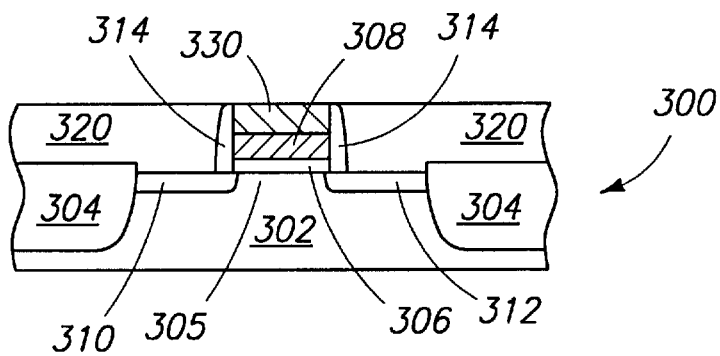

Next, as illustrated in FIG. 3F, a second global planarization is performed on the semiconductor wafer 300, preferably by CMP, again exposing the top of the gate electrode 308. Thus, the upper portion of the gate electrode 308 is replaced by a low resistance material according to a damascene process.

Figure 3G:
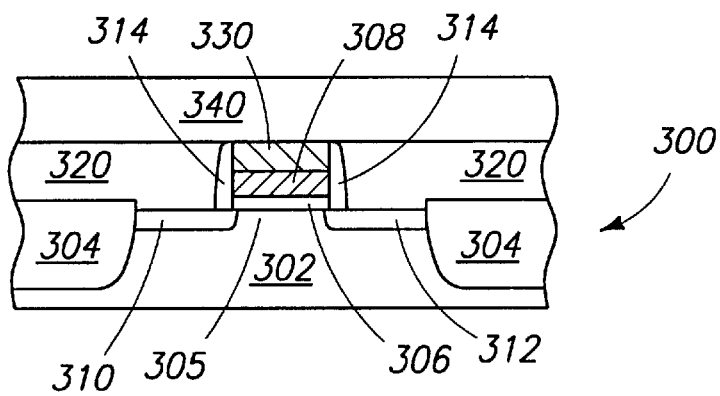

Following completion of the gate electrode, additional processing of the semiconductor wafer 300 may be continued according to conventional procedures in order to complete the desired semiconductor device. As shown in FIG. 3G, a typical step following completion of the gate electrode 308 is the deposition, for example by CVD, of an additional dielectric layer 340 which electrically isolates and separates the gate electrode 308 from a subsequently deposited metal layer (not shown).

Figure 4:
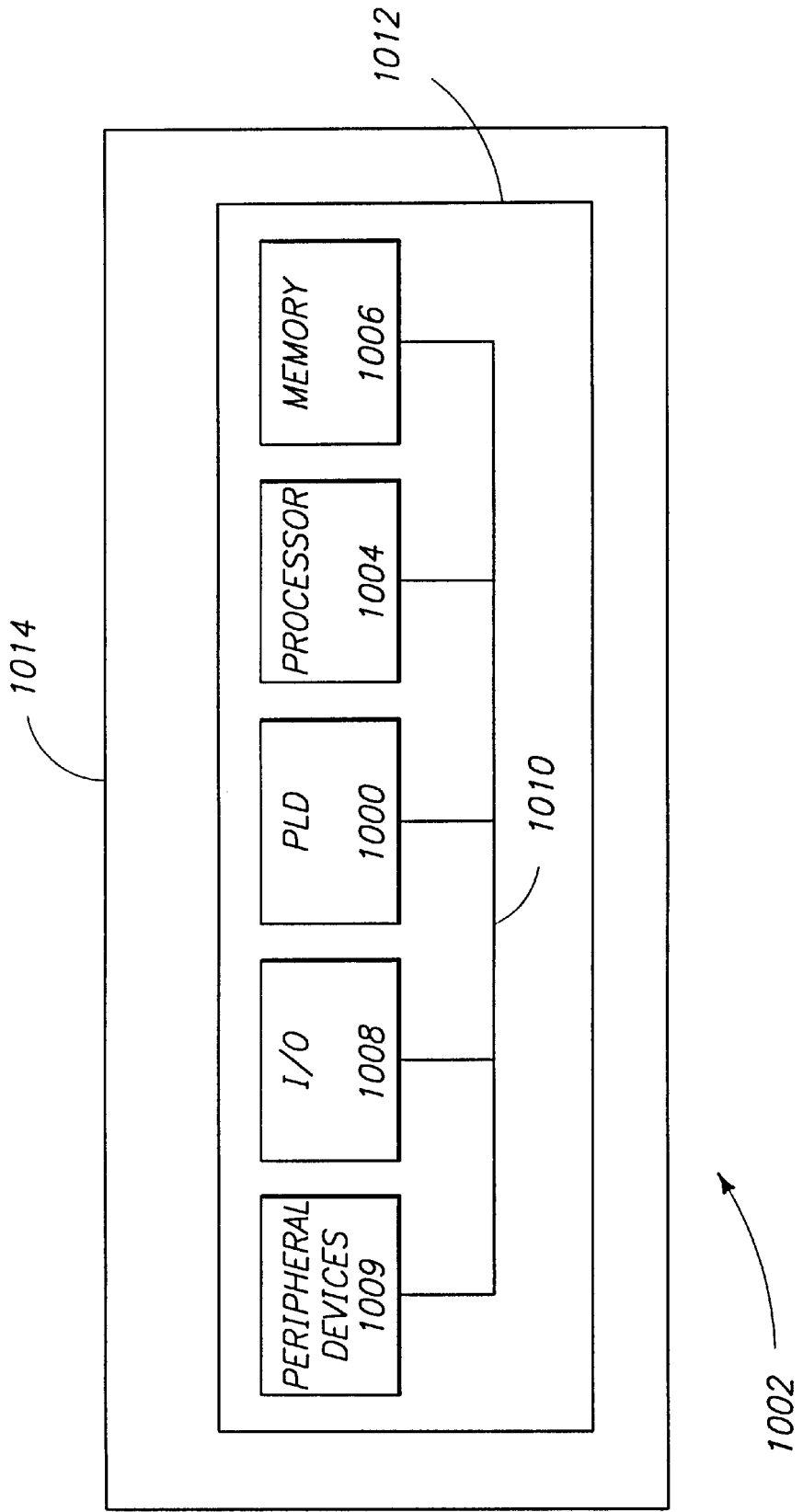
FIG. 4 illustrates one general application of a transistor device in accordance with the present invention as part of a PLD in a data processing system.

FIG. 4 illustrates one general application of the transistor of the present invention as part of a PLD 1000 in a data processing system 1002. The data processing system 1002 may include one or more of the following components: a processor 1004; memory 1006; I/O circuitry 1008; and peripheral devices 1009. These components are coupled together by a system bus 1010 and are populated on a circuit board 1012 which is contained in an end-user system 1014.

The system 1002 can be used in a wide variety of applications, such as computer networking, data networking, instrumentation, video processing, digital processing, or any other application where the advantage of using reprogrammable logic is desirable. The PLD 1000 can be used to perform a variety of different logic functions. For example, PLD 1000 can be configured as a processor or controller that works in cooperation with processor 1004. The PLD 1000 may also be used as an arbiter for arbitrating access to a shared resource in the system 1002. In yet another example, the PLD 1000 can be configured as an interface between the processor 1004 and one of the other components in the system 1002. It should be noted that the system 1002 is only exemplary, and that the true scope and spirit of the invention should be indicated by the following claims.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A gate electrode for a transistor device, said gate electrode having a thickness, comprising:
    an upper portion comprising Al, said upper portion comprising at least about ⅓ of the thickness of said gate electrode; and
    a bottom portion comprising polysilicon.

2. The gate electrode of claim 1, wherein said upper portion of said gate electrode comprises about ½ of the thickness of said gate electrode.

3. The gate electrode of claim 1, wherein said bottom portion of said gate electrode has a thickness sufficient to provide a work function substantially the same as if said bottom portion comprised the entire thickness of the gate electrode.

4. The gate electrode of claim 3, wherein said thickness of said bottom portion is about 100 to 1000 Å.

5. The gate electrode of claim 1, further comprising vertical spacer dielectric regions bordering said gate electrode.

6. The gate electrode of claim 1 further comprising
    a middle portion comprising one or more layers of material.

7. A semiconductor device, comprising:
    a semiconductor wafer having a substrate, source and drain regions in said substrate, a gate electrode having a thickness, and a gate dielectric separating said gate electrode from the source and drain regions in said substrate;

wherein said gate electrode comprises,
an upper portion comprising Al, said upper portion comprising at least about ⅓ of the thickness of said gate electrode; and
a bottom portion comprising polysilicon.

8. The device of claim 7, wherein said upper portion of said gate electrode comprises about ½ of the thickness of said gate electrode.

9. The device of claim 7, wherein said bottom portion of said gate electrode has a thickness sufficient to provide a work function substantially the same as if said bottom portion comprised the entire thickness of the gate electrode.

10. The device of claim 9, wherein said thickness of said bottom portion is about 100 to 1000 Å.

11. The device of claim 7, further comprising vertical spacer dielectric regions bordering said gate electrode.

12. The gate electrode of claim 1, wherein said metal is aluminum.

13. The semiconductor device of claim 7, wherein said metal is aluminum.

14. The gate electrode of claim 6 wherein one of one or more middle layers of material comprises a metal silicide.

15. The gate electrode of claim 6 wherein one of one or more middle layers of materialcomprises a silicon nitride.

* * * * *